US006948968B1

(12) United States Patent  
Shearman et al.

(10) Patent No.: US 6,948,968 B1  
(45) Date of Patent: Sep. 27, 2005

(54) FRONT INSTALLABLE GUIDE AND CIRCUIT CARD CONNECTING DEVICE HAVING SAME

(75) Inventors: Simon Shearman, Almonte (CA); Christian Pouliot, Ottawa (CA); Mitchell O'Leary, Ottawa (CA); Fabien Colton, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 164 days.

(21) Appl. No.: 10/848,158

(22) Filed: May 19, 2004

(51) Int. Cl.[7] ............................................. H01R 13/64
(52) U.S. Cl. ..................................... 439/377; 361/802
(58) Field of Search ................... 439/377, 64; 361/802

(56) References Cited

U.S. PATENT DOCUMENTS

| | | | |
|---|---|---|---|
| 3,932,016 A | | 1/1976 | Ammenheuser |
| 4,068,290 A | | 1/1978 | Wetherbee |
| 4,861,277 A | * | 8/1989 | Bina ........................... 439/377 |
| 5,259,784 A | * | 11/1993 | Iwatare et al. .............. 439/377 |
| 5,477,420 A | * | 12/1995 | Brooks ........................ 361/802 |
| 5,884,779 A | * | 3/1999 | Rich ........................... 361/802 |
| 6,359,788 B1 | * | 3/2002 | Giese et al. ................ 439/377 |
| 6,552,915 B2 | | 4/2003 | Takahashi et al. |

* cited by examiner

*Primary Examiner*—Tho D. Ta

(57) ABSTRACT

A front installable guide for a circuit card connecting device is provided. The connecting device has a circuit card connector. The guide has a pair of elongated alignment pins. Each of the pins terminates in a fastener for attachment to the connecting device adjacent the connector. The guide also has a guiding member. The guiding member has a groove which is slidably engagable with an edge of a circuit card. A pair of parallel channels is formed in the guiding member for reception of the alignment pins such that when the alignment pins are received in the channels and attached to the connecting device, the groove is aligned for reception of a circuit card to be connected to the connecting device. The guiding member can provide support for the received circuit card.

20 Claims, 11 Drawing Sheets

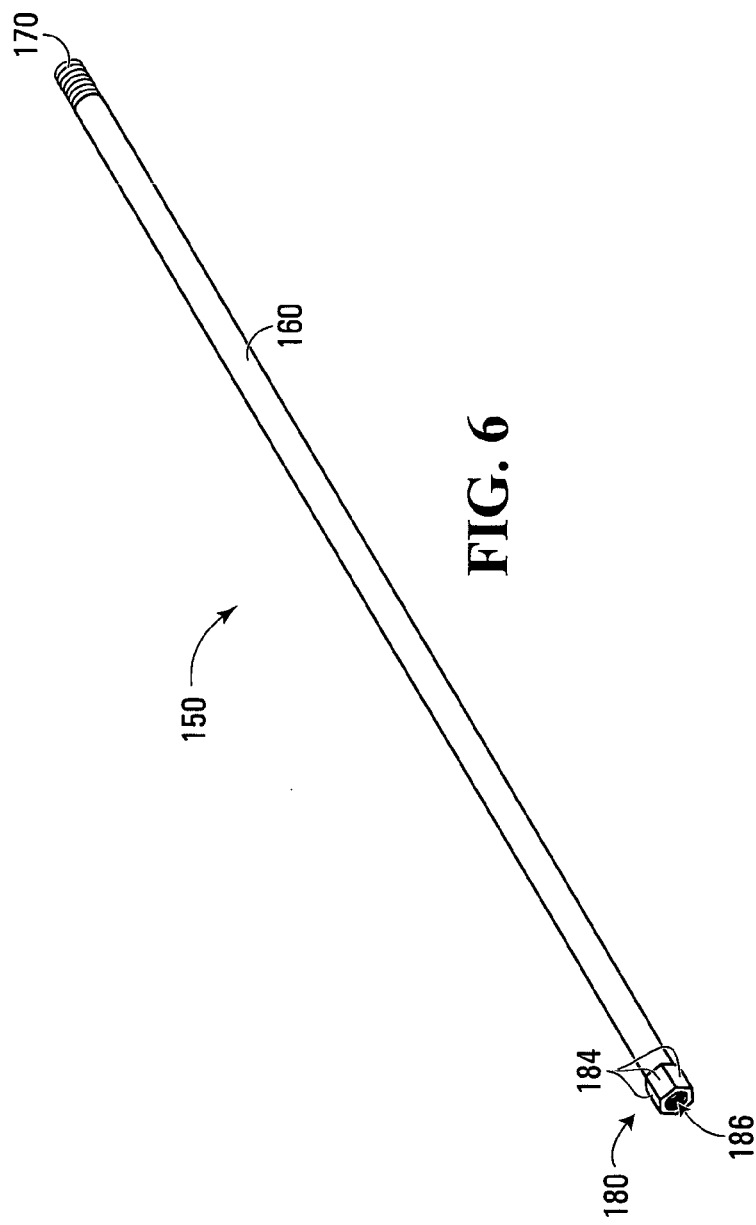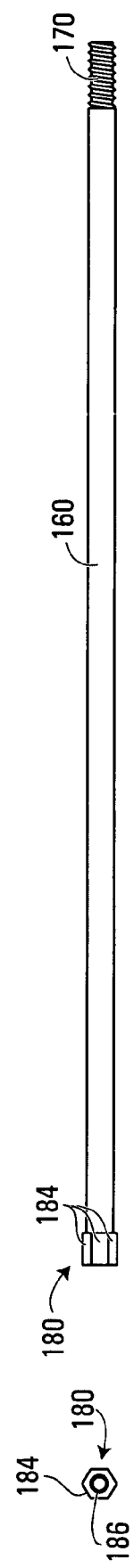

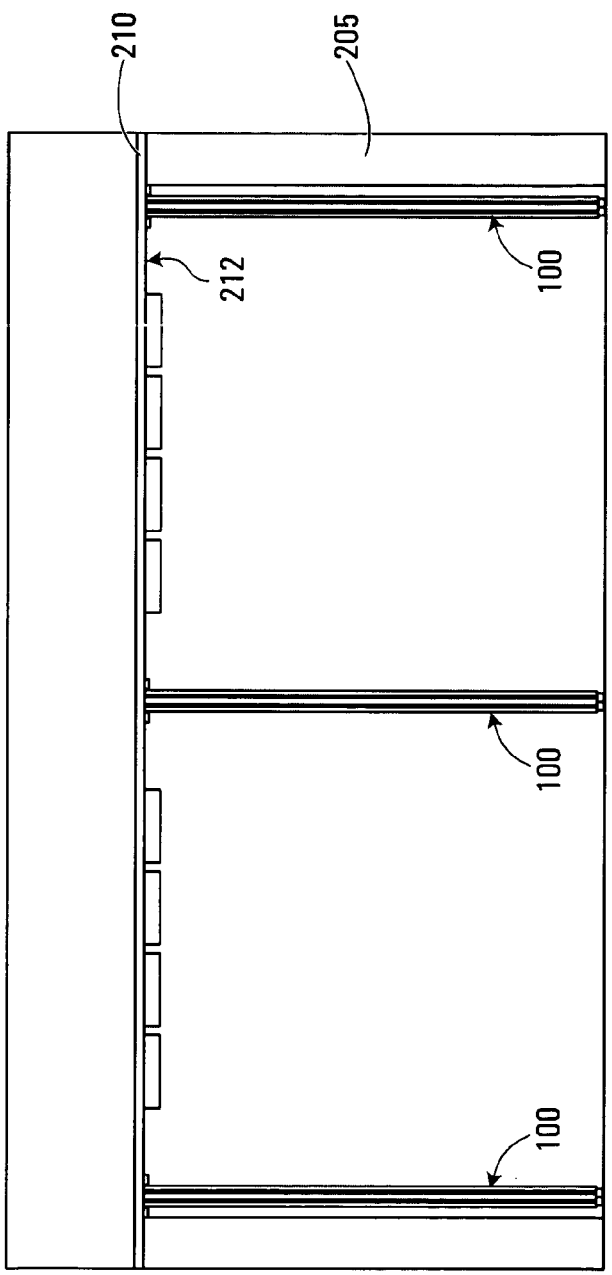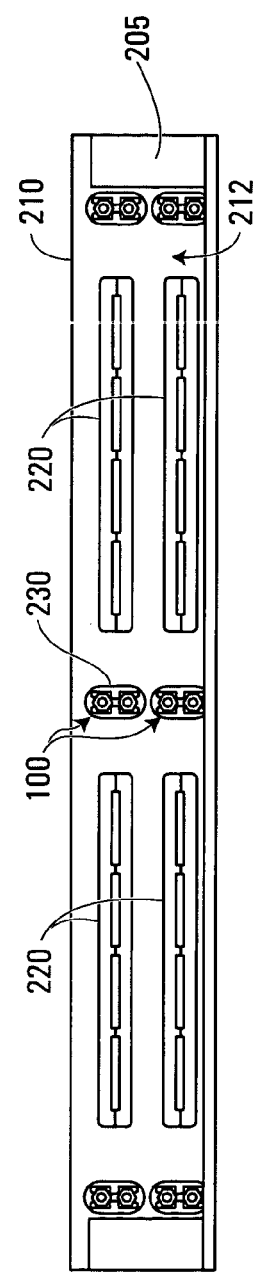
FIG. 10
FIG. 11

FRONT INSTALLABLE GUIDE AND CIRCUIT CARD CONNECTING DEVICE HAVING SAME

FIELD OF THE INVENTION

This invention relates to connecting circuit cards and, more particularly, to front installable guide and circuit card connecting devices having same.

BACKGROUND OF THE INVENTION

Circuit card connecting devices, such as card racks and other host devices of pluggable modules, often have guides for guiding the insertion of a circuit card into a card receptacle on a back panel. Attempts have been made to develop removable card guides so that circuit cards having different sizes may be inserted on the same back panel. For example, U.S. Pat. No. 4,068,290 to Wetherbee, issued on Jan. 10, 1978, discloses a circuit card guide adapted to be fastened to a card rack in a temporary fashion between permanently attached card guides so as to permit the guiding and retaining of circuit cards having a width substantially less than the spacing between the permanent guides. However, to install or remove the circuit card guide disclosed in Wetherbee, access to the back of the card rack is required. This is a disadvantage because accessing the back of the rack may cause interruption of the operation of cards in the rack. It may also be inconvenient to access the back of the rack, for example, when the rack is large and its back is close to a wall.

In a simple construction, a card guide can have a screw end so that it can be screwed into the front side of the back panel. However, such a guide is difficult to use because it is difficult to orient the guide. Further, when the guide is long it may be unstable.

U.S. Pat. No. 6,552,915 to Takahashi et al, issued on Apr. 22, 2003, discloses a telecommunications apparatus with a sub-rack unit into which an intermediate guide rail member may be inserted from the front. The intermediate guide rail member is mounted by tightening a lock bolt member similarly inserted from the front of the sub-rack unit. The intermediate guide rail member allows the sub-rack to accommodate smaller cards. While the intermediate guide rail member is mountable from the front side of the apparatus, it still has some disadvantages. The construction of the sub-rack unit and of the intermediate guide rail member is complicated. The sub-rack unit occupies a large surface area on the apparatus and may not be suitable for use in applications where space is limited such as when multiple circuit cards need to be closely housed. The sub-rack unit and the intermediate guide rail members are also not suitable for mounting on many existing racks or connecting devices, such as many standard circuit card connecting devices. Further, such a sub-rack unit limits the permissible maximum length of a sub-card and is not suitable for use in devices such as Small Form Pluggable (SFP) and 10 Gigabit Small Form Factor Pluggable (XFP) devices where it is desirable to maximize the accessible length of a card plugged therein.

Therefore, there is a need for a removable and front installable circuit card guide that has a simple construction and can be installed on different back panels, particularly on existing standard back panels.

SUMMARY OF THE INVENTION

In accordance with an aspect of the invention, there is provided a guide for a circuit card connecting device, the connecting device having a circuit card connector, the guide comprising a pair of elongated alignment pins each terminating in a fastener for attachment to the connecting device adjacent the connector; a guiding member defining at least one groove slidably engagable with an edge of a circuit card and a pair of parallel channels for reception of the alignment pins such that when the alignment pins are received in the channels and attached to the connecting device, the guiding member is aligned for receiving, in the at least one groove, a circuit card to be connected to the connecting device.

In accordance with another aspect of the invention, there is provided a circuit card connecting device comprising a base having a connector to allow connection of a circuit card from a front side of the base; a pair of elongated alignment pins projecting from the front side of the base adjacent the connector; a guiding member defining at least one groove slidably engagable with an edge of the circuit card and a pair of parallel channels receiving the alignment pins such that the alignment pins align the guiding member for receiving, in the at least one groove, the circuit card for connection to the connector.

In accordance with a further aspect of the invention, there is provided a guide for a circuit card connecting device, the connecting device having a connector for connecting a circuit card on its front side, the guide comprising a pair of alignment means rotatably attachable to the connecting device adjacent the connector; a guiding member having guiding means for slidably engaging a circuit card and receiving means for reception of the alignment means in parallel such that when the alignment means are received in the guiding member and attached to the connecting device, the guiding member is aligned for engagement with a circuit card to be connected to the connecting device.

Other aspects, features, and advantages of the invention will become apparent by reference to the following description and the drawings.

BRIEF DESCRIPTION OF THE DRAWINGS

In the following drawings which illustrate exemplary embodiments of the invention:

FIG. 6 is a perspective view of a second component of the card guide of FIG. 1.

FIG. 7 is a front elevation of the second component of FIG. 6;

FIG. 8 is a side elevation of the second component of FIG. 6;

FIG. 10 is a top plan view of the connecting device of FIG. 9;

FIG. 11 is a front elevation of the connecting device of FIG. 9;

DESCRIPTION OF EXEMPLARY EMBODIMENTS

Figure 1:
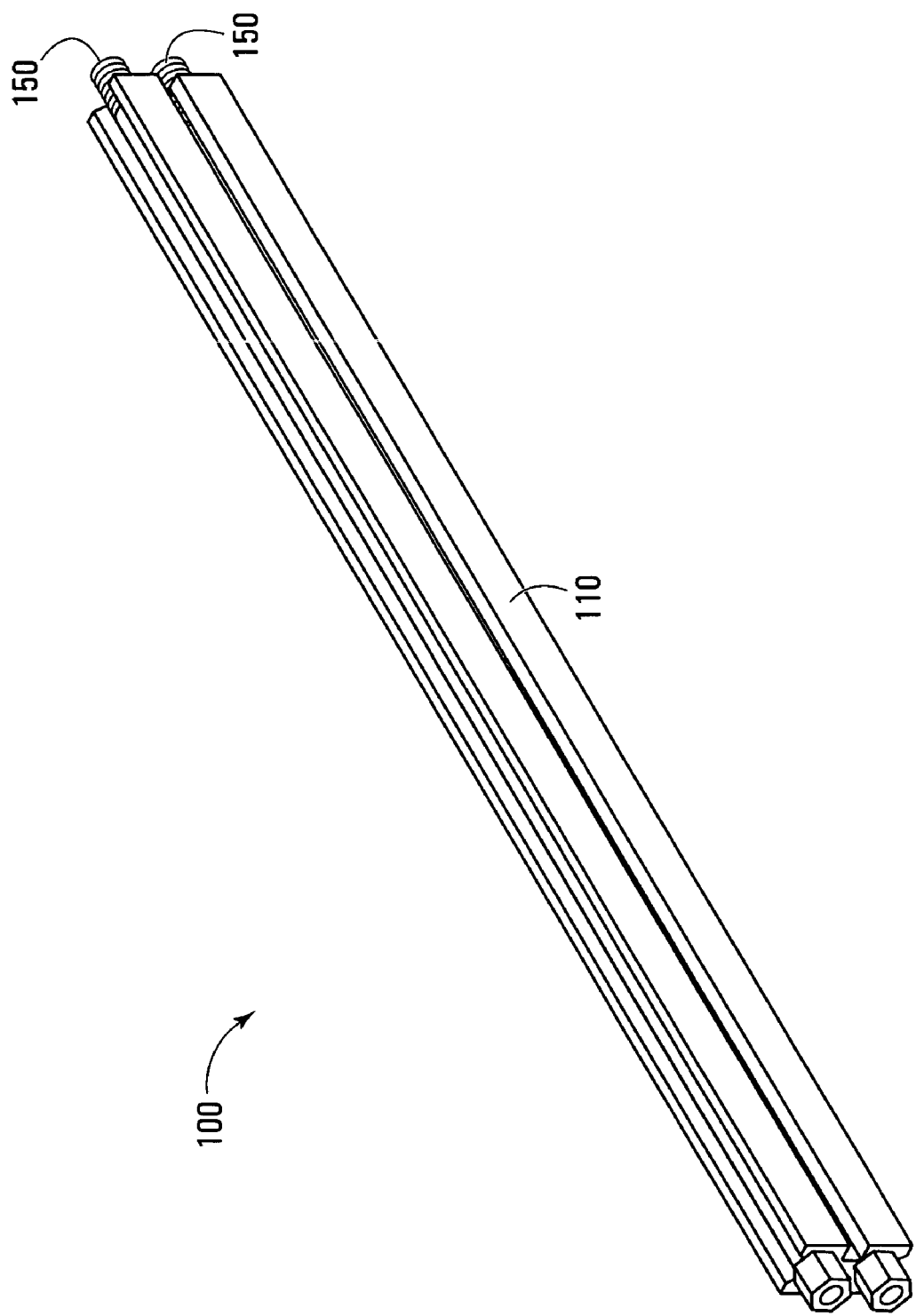
FIG. 1 is a perspective view of a card guide in an assembled position.
Figure 2:
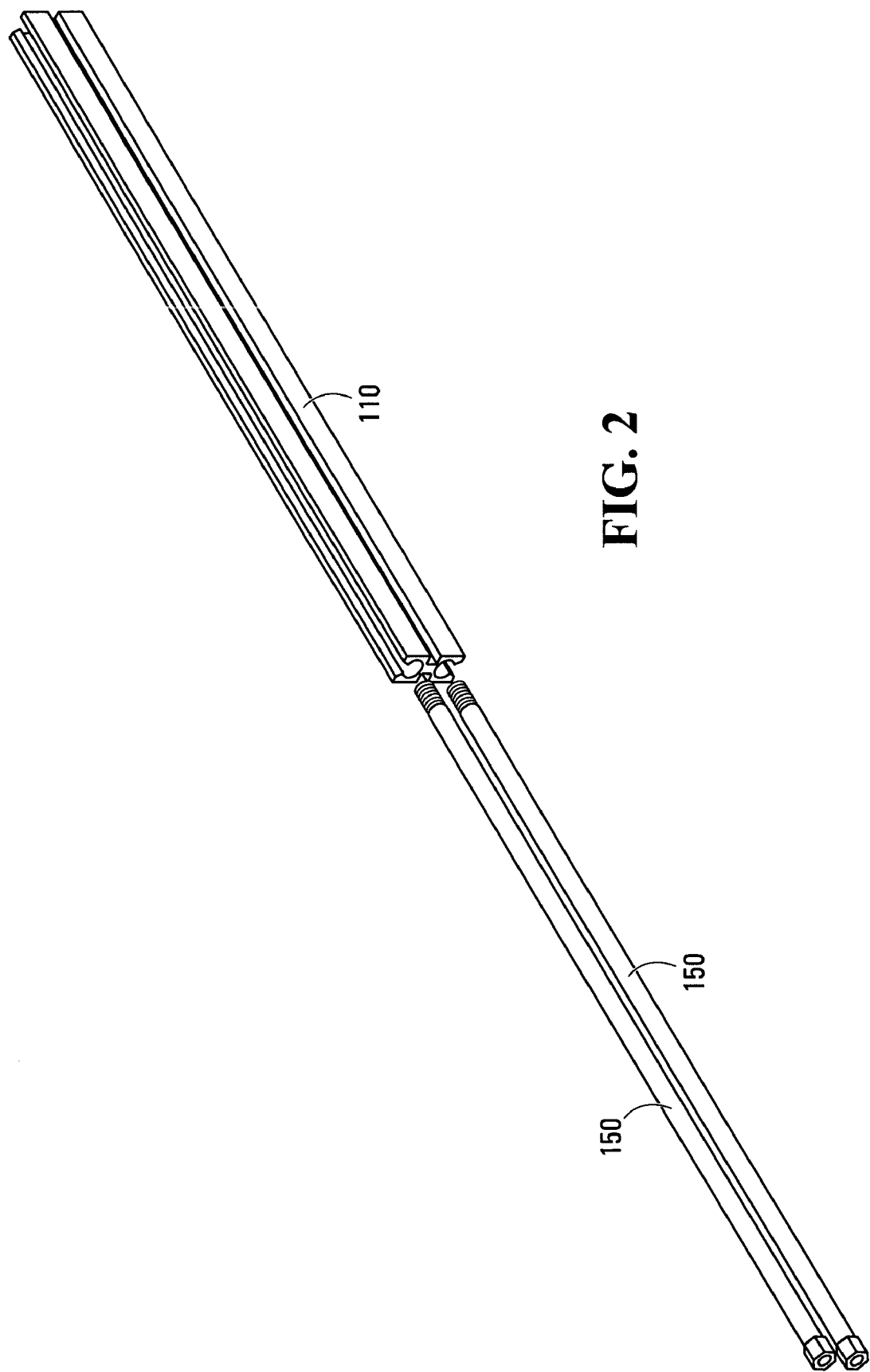
FIG. 2 is a perspective view of the card guide of FIG. 1, in a pre-assembled position.

Referring to FIGS. 1 and 2, an exemplary embodiment of an aspect of the invention is a guide 100 for circuit card connecting devices, which include host devices of pluggable modules. Circuit cards include electrical pluggable elements such as pluggable modules, printed circuit boards, cartridges, and the like. A circuit card can be generally planar, or, it can be non-planar but have suitable guidable edges. The guide 100 includes an elongated guiding member 110 and two elongated rods 150. As will become clear below, rods 150 can serve as alignment pins for the guiding member 110.

Figure 4:
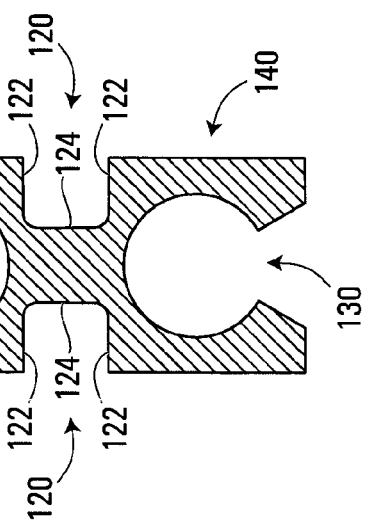
FIG. 4 is a sectional view of the first component of FIG. 3 taken along the line IV—IV.
Figure 3:
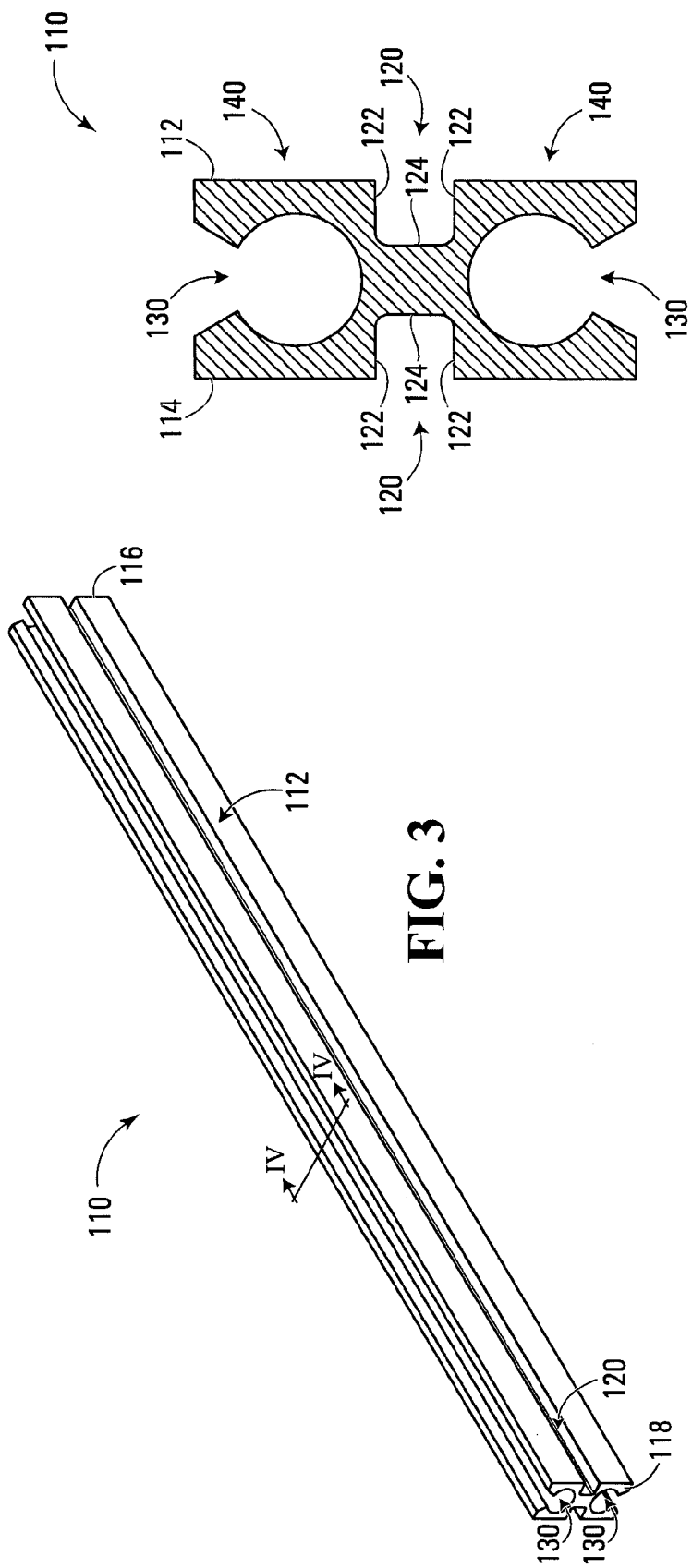
FIG. 3 is a perspective view of a first component of the card guide of FIG. 1.
Figure 5:
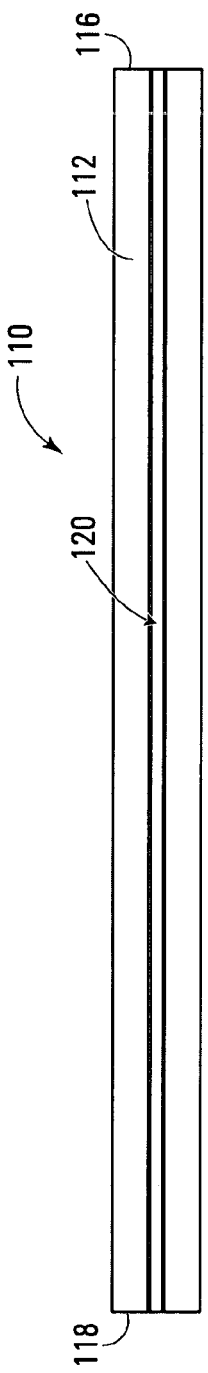
FIG. 5 is a side elevation of the first component of FIG. 3.

Referring to FIGS. 3 to 5, the guiding member 110 defines two grooves 120 and two channels 130 extending in parallel between its two ends 116 and 118. The guiding member 110 can be considered as including two joined sleeves 140 each having a channel 130. The sleeves 140 may be integrally or separately formed.

The grooves 120 are formed on opposite sides 112 and 114 of the guiding member 110 and are in alignment with each other. Each groove 120 is substantially U-shaped in cross-section and is defined by two opposing side walls 122 and a bottom wall 124.

Each channel 130 can receive a rod 150 therein and is configured to allow rotation of a received rod 150. As depicted, each channel 130 is substantially C-shaped in cross-section but it can have a different suitable cross-section, such as a circular or square cross-section. It may be advantageous to have a C-shaped cross-section. For example, it may be easier to extrusion form a guiding member with a side opening than one that does not have a side opening. The side opening of a channel 130, however, can be sufficiently narrow so that a rod 150 received in the channel 130 is not allowed to leave the channel 130 laterally through the side opening.

Referring to FIGS. 6 to 8, each rod 150 has an elongated cylindrical body 160. The rod 150 terminates, at one end, in a threaded foot 170 and, at the other end, in an enlarged head 180. The diameter of the cylindrical body 160 is sufficiently small so that the rod body 160 can be received in a channel 130 and can rotate therein. The rod body 160 is sufficiently long so that the foot 170 and head 180 can respectively extend beyond the ends 116 and 118 of the guiding member 110 when the rod body 160 is received in the guiding member 110. The foot 170 has a screw thread such as a bolt thread for attachment to a circuit card connecting device, as will be further described below. The enlarged head 180 is larger in size than the cross-section of a channel 130. As depicted, the enlarged head 180 has a hex nut shape with three pairs of opposed, generally flat faces 184. However, the head 180 may have another suitable shape. The opposed flat faces 184 on the head 180 may be conveniently used to rotate the rod 150. The enlarged head 180 may be integrally formed on the body 160 or may be removably mounted on the body 160. When removably mounted, the head 180 may be a hex nut which threads to the body 160.

The head 180 may have a threaded bore 186 for receiving a fastener such as a screw (not shown). The use of the threaded bore will become clear below. The diameter of the threaded bore 186 may be smaller than the diameter of the threaded foot 170 so that a larger torque would be required to loosen the foot 170 than to loosen a screw in the threaded bore 186. This is advantageous because the screw can be removed without loosening the rod 150.

The guiding member 110 and rod 150 can be made of any suitable material. Rigid and extrudable metals such as aluminium 6063 can be advantageously used for forming the guiding member 110. Strong material such as 304 Stainless Steel may be advantageously used for forming the rod 150. A steel rod inside an aluminium guiding member can form a support that is resistant to lateral deflection. The steel rod and the aluminium guiding member can have a close or snug fit without creating a large frictional force therebetween. While a suitable plastic material can also be used to form parts of the guide 100, plastic parts may be less resistant to lateral deflection than similarly sized and shaped metal parts.

Figure 9:
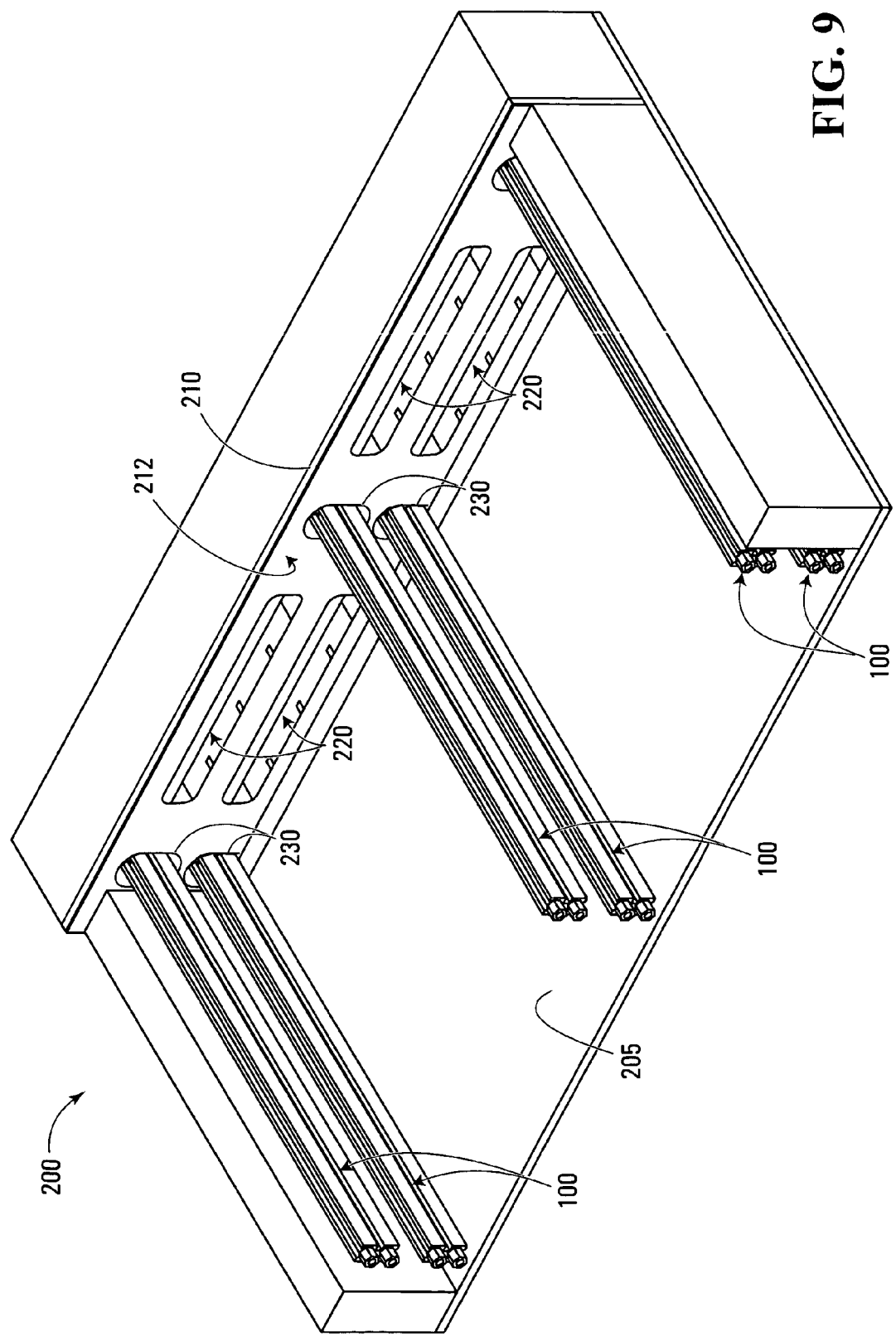
FIG. 9 is a perspective view of a card connecting device having the card guides of FIG. 1 installed thereon.

FIGS. 9 to 11 illustrate a circuit card connecting device 200 on which one or more guides 100 are removably mounted. The card connecting device 200 includes an optional frame 205, a base such as a connector panel 210 mounted on the frame 205, and one or more card guides 100 removably attached to the connector panel 210.

The connector panel 210 has a front side 212. One or more circuit card connectors, such as card receptacles 220, are provided on the front side 212. Often, a connector on a card connecting device is a receptacle such as depicted in FIGS. 9 to 11. However, a connector can be of other types. For example, a connector can include projections such as connecting pins and a circuit card to be connected may have complementary pin receptacles for receiving the connecting pins.

The connector panel 210 has a number of threaded sockets 230 on the front side 212 for reception of rods 150. A socket 230 can be a hole or a bore having a screw thread complementary to the screw thread on the foot 170 of a rod 150. A guide 100 can be mounted on the connector panel 210 from the front side 212 by first inserting rods 150 into the guiding member 110 and then engaging a pair of sockets 230 with the feet 170 of the rods 150. The rods 150 can be rotated to engage the sockets 230. The heads 180 may be used to rotate and tighten the rods 150. The rods 150 may be so tightened that the heads 180 abut the guiding member 110 to secure the guiding member 110 in an aligned position. A pair of guides 100 may be installed adjacent opposite ends of one or more receptacles 220. A card guide 100 may be removed from the connector panel 210 from the front by detaching the rods 150 from the sockets 230. Alternatively, as can be appreciated, if the heads 180 are removable from the bodies 160 of the rods 150, a guiding member 110 mounted thereon may be removed without removing the bodies 160.

Figure 12:
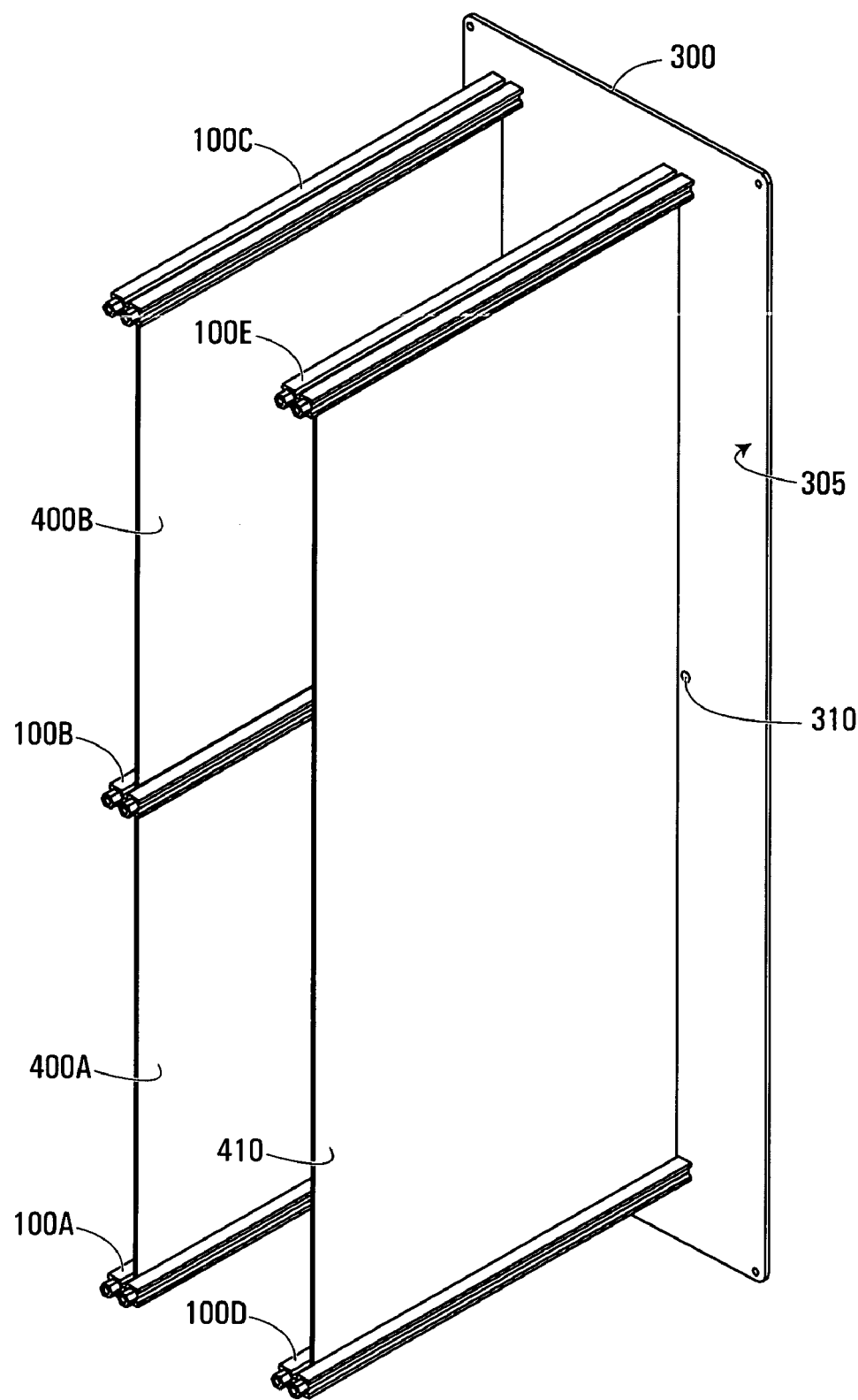
FIG. 12 is a perspective view of a partial card connecting device illustrating the use of card guides of FIG. 1.
Figure 13:
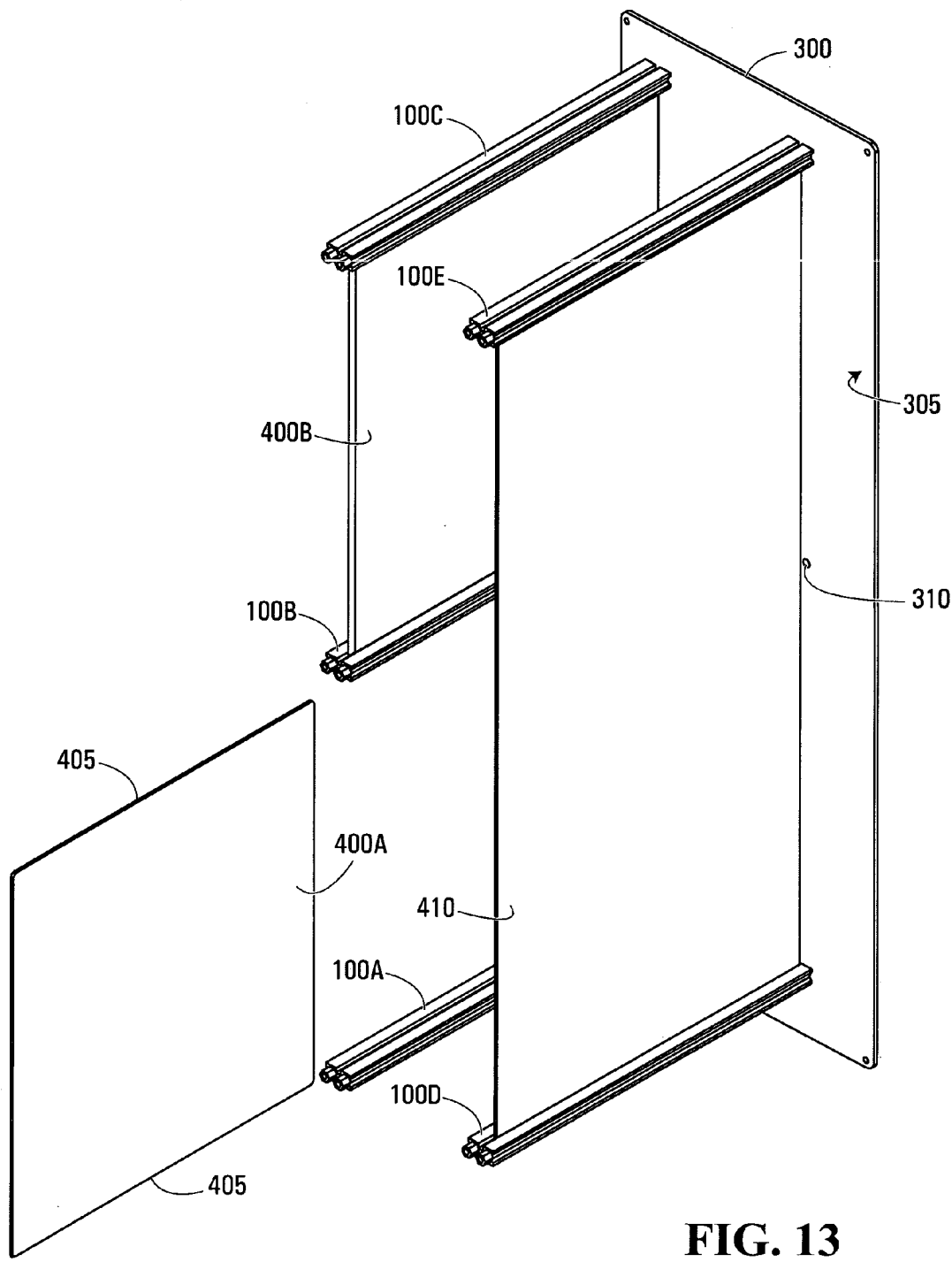
FIG. 13 is a perspective view of the card connecting device of FIG. 12 illustrating the installation or removal of a circuit card therefrom.

In use, as schematically illustrated in FIGS. 12 and 13, one or more card guides 100 may be mounted on a base 300 of a circuit card connecting device for reception of one or more circuit cards 400A, 400B (also individually and collectively referred to as circuit card 400) and 410 which are to be connected to the base 300 at its front side 305. A circuit card, such as card 400A, can be installed or removed under support and guidance of one or two guides 100, such as guides 100A and 100B. Opposite edges 405 of the circuit card 400A may be respectively received and slidably engaged with the grooves 120 of a pair of opposing card guides 100A and 100B. In this regard, an opposing pair of side walls 122 of a groove 120 on a guiding member 110 may be spaced apart at a distance roughly equal to the thickness of the edges 405 of the circuit card 400A for close engagement therewith. As can be appreciated, guides 100 can not only guide connection of a circuit card 400 or 410 to the base 300 but also provide support for the circuit card when the circuit card is connected.

Since the guides 100 or guiding members 110 can be easily installed or removed from the front side 305 of the base 300 without accessing the back of the base 300, the connecting device can be easily configured to provide different card connections. For example, as illustrated in FIGS. 12 and 13, circuit cards having different sizes can be accommodated by removing or installing an intermediate guide 100 or guiding member 110. As depicted, it is assumed that an intermediate guide 100 mounted at sockets 310 between guides 100D and 100E has been removed to accommodate the large card 410.

As now can be understood, the rods 150 can conveniently serve multiple functions. First, the attachment of two rods 150 to the base may be used to ensure that each groove 120 is aligned properly for reception of a circuit card to be connected to the base. Therefore, alignment of the grooves 120 with the circuit card connecting device does not pose any particular difficulty during installation, so long as the rods 150 are properly positioned on the base 300.

Secondly, the rods 150, when mounted, can provide support for the guiding member 110 so that the guide 100 is stable and can in turn provide stable support for a circuit card to be connected to a connecting device. In this regard, two or more rods can provide better support than one rod does. Further, in an alternative embodiment, one of the two rods can be configured to provide primarily support while the other rod can be configured to provide primarily alignment.

Thirdly, a rod 150 with its enlarged head 180 may serve as a fastener for securing the guiding member 110 in an aligned position. In this regard, the rods 150 can be attached to the base 300 after being inserted into a guiding member 110, in which case when the rods 150 are rotated the guiding member 110 will remain stationary. Alternatively, heads 180 may be removable from the rods 150, as by each head 180 being a hex nut threaded to a rod body 160. In the latter case, a pair of rods 180 may be attached to a base and, thereafter, their heads 180 may be removed and a guiding member 110 slid onto the rod bodies 160, then the heads 180 re-attached to retain the guide member 110 on the rods 150. While the guiding member 110 can be secured with only one fastener, two fastening rods 150 can provide better security and support.

Further, the head 180 may be engagable with another fastener for various purposes. For example, when the heads 180 of the rods 150 are provided with threaded bores 186, the bores 186 can be used to secure the installed circuit card. For instance, a clamping bar (not shown) may be secured to the heads, by screws (not shown) engaging the bores 186, after a circuit card has been installed so that the clamping bar abuts against the installed card. Where a number of circuit cards are installed in series, alternatively opposite bores 186 may be used for securing each card. For instance, in FIG. 12, card 400A can be secured using the right bore of guide 100A and the left bore of guide 100B, while card 400B can be secured using the right bore of guide 100B and the left bore of guide 100C. The threaded bore 186 may also be used for other purposes. For example, it may be used for fastening the head 180 to a front crossbar (not shown) attached to the frame of a connecting device, or for fastening the feet of another rod 150 for connecting two guides 100 in series. It may also be used to attach a plate or bracket (not shown) for clamping the two heads 180 and the front portion of the guiding member together.

Optionally, a block member may be mounted adjacent the head 180 such that the block member extends laterally from the rod 150. Such a block member can be useful for various purposes. For example, the block member may be used to provide a leveraging platform for a pluggable module that has a latch. As is known, a pluggable module may have one or more latches for extracting the module from a host device.

Figure 14:
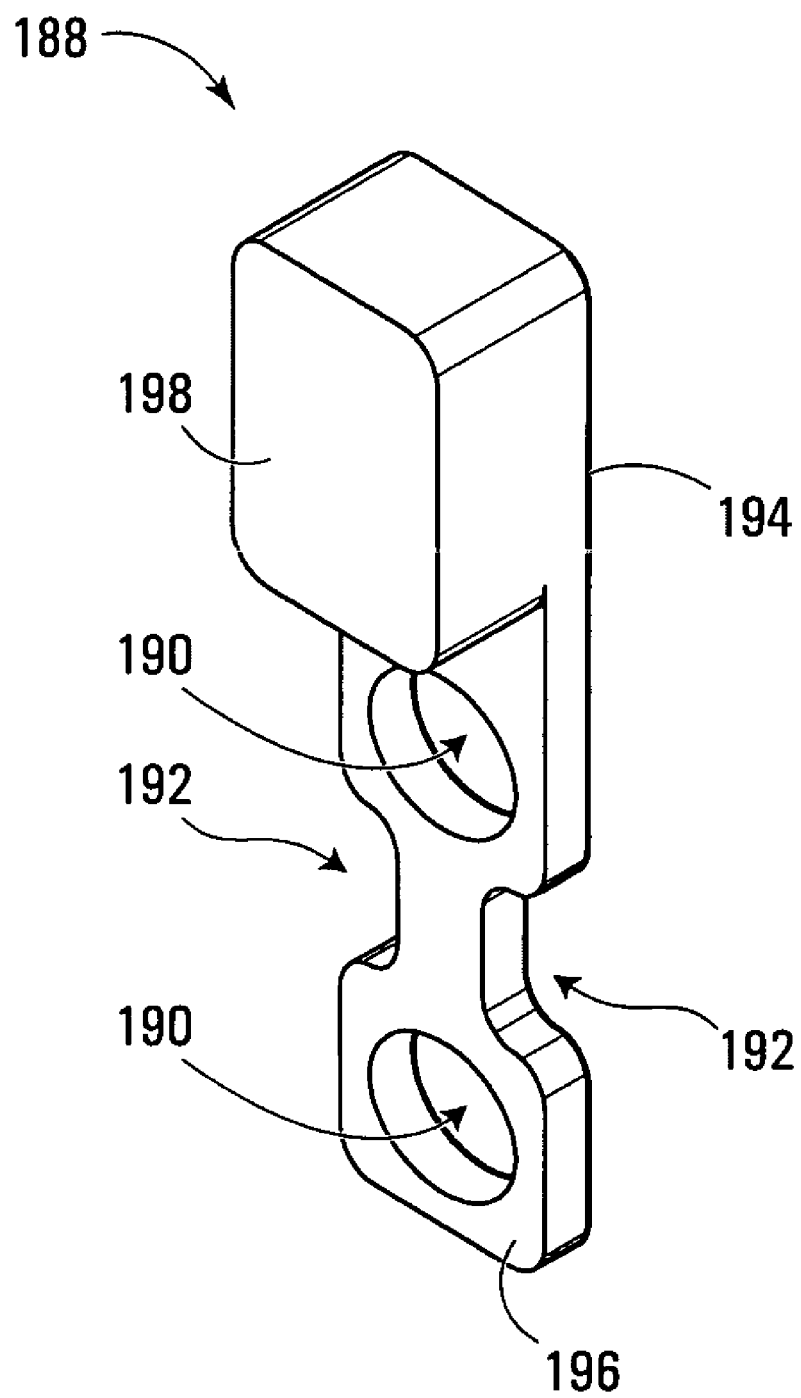
FIG. 14 is a perspective view of a block member mountable on the card guide of FIG. 1.
Figure 15:
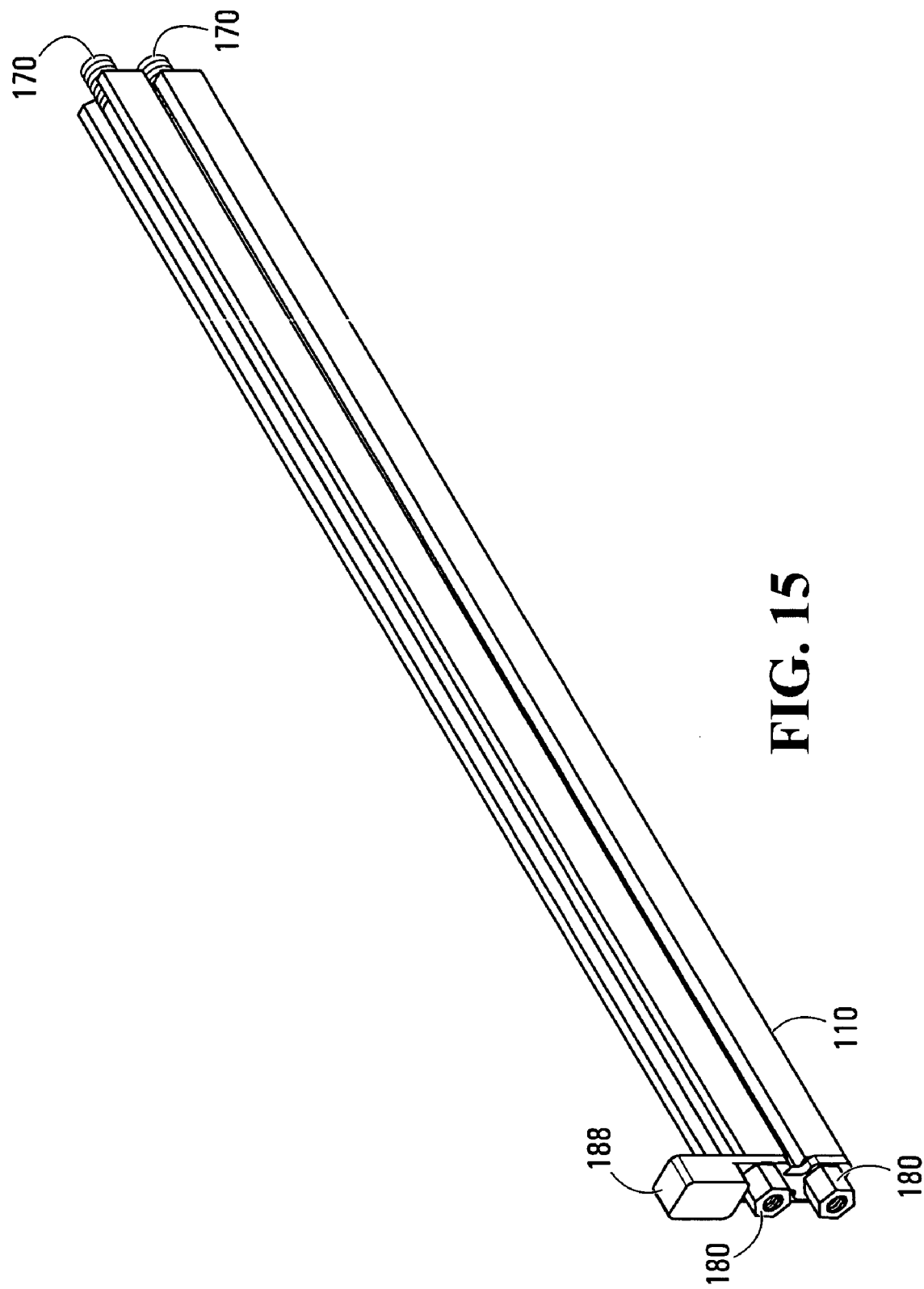
FIG. 15 is a perspective view illustrating the card guide of FIG. 1 in an assembled condition with the block member of FIG. 14 mounted thereon.

An exemplary block member 188 is shown in FIG. 14. The block member 188 defines a pair of openings 190 which are shaped and sized for receiving the rod bodies 160 and a pair of grooves 192 for respectively receiving an edge of a circuit card 400. The block member 188 has a flat side 194 and a stepped side 196 which has a raised latching face 198. The block member 188 may be sandwiched between the enlarged heads 180 of rods 150 and the guiding member 110 with the latching face 198 facing away from the feet 170 of the rods as illustrated in FIG. 15.

Figure 16:
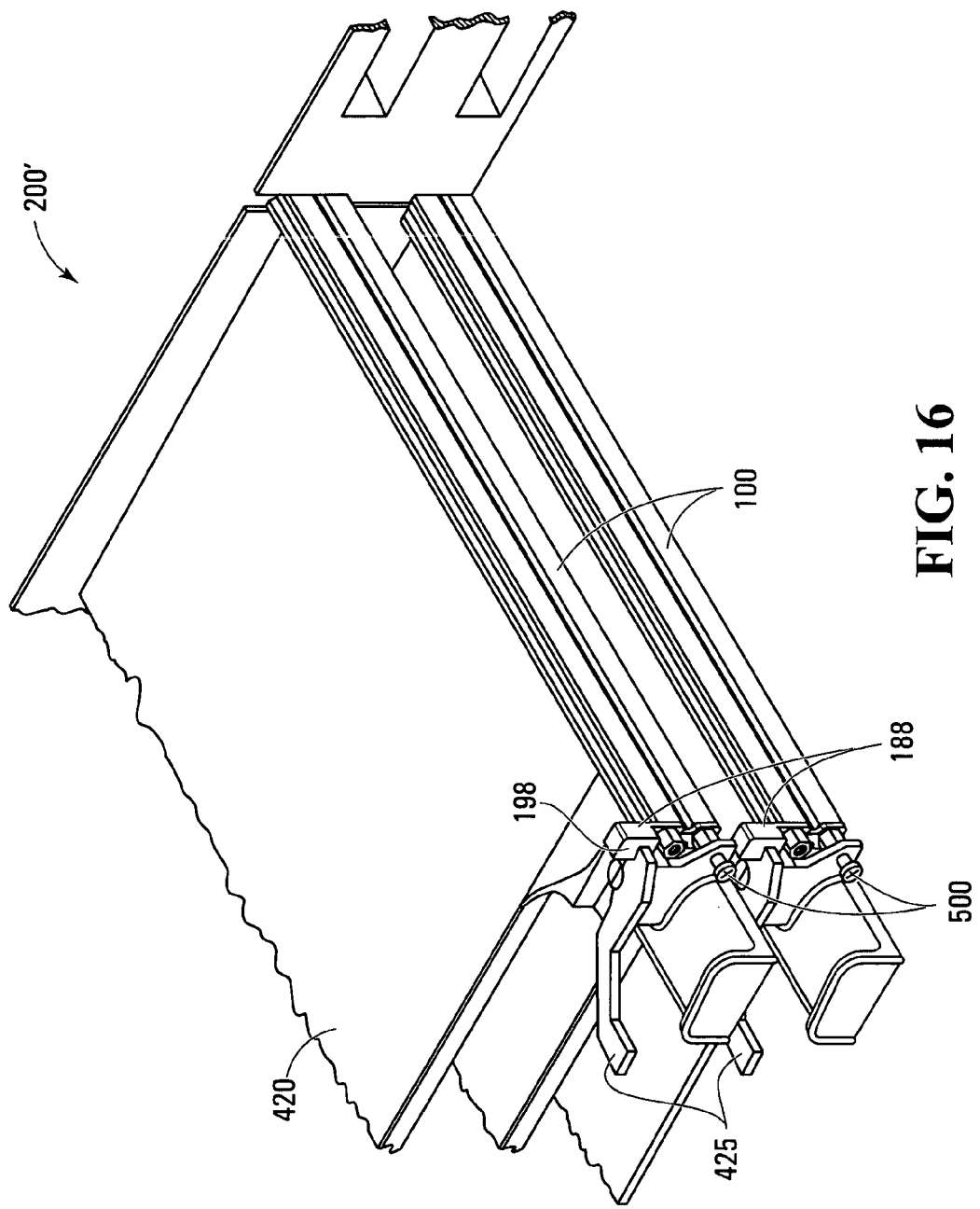
FIG. 16 is a partial perspective view of a connecting device illustrating the use of the card guide of FIG. 15.

The block member 188 can be advantageously used with circuit cards that have latching mechanisms as illustrated in FIG. 16. Referring to FIG. 16, a circuit card 420 is connected to a connecting device 200'. The circuit card 420 has a latch 425 at each side of its front (only one corner portion of the circuit card 420 is shown). The guide 100 mounted on the device has the optional block members 188 mounted thereon. The latching face 198 provides a push-off platform for the latch 425 for extracting the circuit card 420 from the connecting device 200'. The circuit card 420 may be secured by a screw 500 received in and engaged with one of the threaded bores 186 of the guide 100. As can be understood, block member 188 may be alternatively attached to the end of the guide 100 using one or more of the threaded bores 186.

The block member 188 can also be modified so that it can be used for blocking air flow in a connecting device. For example, a block member may extend along a front edge of a circuit card received in the connecting device and have a length substantially equal to the length of the front edge so that, when mounted, the block member will extend along substantially the full length of the front side of the circuit card and block air flow through the front of the card.

It is now apparent that the guide 100, particularly the guiding member 110, can be installed or removed from the front side of a connector panel without accessing the back of the connector panel or the back of a circuit card connecting device. Since support and alignment are provided within the guide 100, as by receiving the rods 150 in the channels 130, the guide 100 can be compact in size and non-protrusive. Thus, the guide 100 can be stably supported and properly aligned without much difficulty, and without cluttering the surface area in front of the base. The guides 100 can be conveniently installed on standard circuit card connecting devices, many of which provide standard bores adjacent the connectors thereon. The fastener feet 170 of the rods 150 can be configured for reception in the standard bores.

It can be understood by persons skilled in the art that the previously described embodiments can be modified without losing all of their benefits and advantages.

As can be appreciated, it can be advantageous for a guide 100 to have two identical rods 150 and two identical channels 120 on the guiding member 110, for example, for reducing the manufacturing cost and for ease of assembly. However, the channels and the rods can be of different shapes and sizes. For instance, one of the two channels may extend through the ends of the guiding member while the other channel may extend only halfway through from the end to be attached adjacent to the base, wherein proper support and alignment of the guiding member can still be provided.

For securing the guiding member in its aligned position, a fastener separate from the rods may be used. For example, the guiding member may have a third channel for a third rod which merely fastens the guiding member to the connecting device, in which case two alignment pins without enlarged heads may be used to align the guiding member. Further, fasteners of a type other than a bolt-and-nut type may be used to secure a guiding member in an aligned position. For example, screws, locking keys, locking pins, clamps, and the like may be used as fasteners for securing the guiding member on an alignment pin.

An alignment pin does not have to be detachable from the guiding member. For example, it can be non-removably but rotatably housed in a channel of the guiding member. Removable pins have the advantage of easy replacement. An advantage for non-removable pins is that components of a guide will not get separated and lost.

As can be appreciated, rotatable engagement between an alignment pin and a guiding member are also possible when the alignment pin and the channel of the guiding member have suitable complimentary shapes other than those depicted in the drawings, such as when one is circular and the other is a regular polygon. Thus, the alignment pins do not need to be cylindrical. However, it may be desirable that the alignment pin (rod 150) and the channel of the guiding member have similar cross-sectional shapes with a close fit because such a configuration can better resist lateral deflection for a given channel size. It can be appreciated that such a configuration can maximize the mass, moment of inertia and second moment of inertia of the guide for a given overall size and component materials.

Further, the alignment pin could be designed to be mounted without rotation, such as by the use of a clamp or a detent tab at its foot. When the alignment pin can be mounted without rotation, it may not be necessary that the alignment pin be rotatable within the channel. In such a case, both the alignment pin and the channel can have a non-circular shape, such as an oval or rectangular shape.

In different embodiments, the guiding member 110 may define only one groove 120 or may define more than two grooves for reception of one or more circuit cards. More than one groove may also be formed on one side of the guiding member. Further, depending on configuration of the connecting device, it is not necessary that a groove be parallel to another groove, or to the channels, on the same guiding member.

The guide 100 can be modified for use in many different card connecting devices, including different host devices, for connecting different circuit cards such as SFPs and XFPs.

The above description of the exemplary embodiments should not be interpreted in a limiting manner since other variations, modifications and refinements are possible without departing from the teachings of this description. Such variations, modifications and refinements are intended to be included in the scope of the invention which is defined in the claims.

What is claimed is:

1. A guide for a circuit card connecting device, said connecting device having a circuit card connector, said guide comprising:
   a pair of elongated alignment pins each terminating in a fastener for attachment to said connecting device adjacent said connector;
   a guiding member defining at least one groove slidably engagable with an edge of a circuit card and a pair of parallel channels for reception of said alignment pins such that when said alignment pins are received in said channels and attached to said connecting device, said guiding member is aligned for receiving, in said at least one groove, a circuit card to be connected to said connecting device.

2. The guide of claim 1 wherein said guiding member has two opposite sides, each of said sides defining one of said at least one groove.

3. The guide of claim 1 wherein said at least one groove is substantially parallel to said channels.

4. The guide of claim 1 wherein each of said at least one groove is substantially U-shaped and wherein each of said channels is substantially C-shaped or cylindrical.

5. The guide of claim 1 wherein said fastener of each of said alignment pins is a screw thread and wherein a channel of said channels receiving a given alignment pin is configured so as to allow rotation of said given alignment pin.

6. The guide of claim 5 wherein at least one of said alignment pins has an enlarged head remote from its fastener for abutting said guiding member when said at least one alignment pin is received in one of said channels and attached to said connecting device so as to secure said guiding member in an aligned position.

7. The guide of claim 6 wherein said fastener is a first fastener and said enlarged head is engagable to a second fastener for securing a circuit card connected to said connecting device and received in said groove.

8. The guide of claim 7 further comprising a block member mountable adjacent said enlarged head such that said block member extends laterally from said at least one alignment pin.

9. A circuit card connecting device comprising:
   a base having a connector to allow connection of a circuit card from a front side of said base;
   a pair of elongated alignment pins projecting from said front side of said base adjacent said connector;
   a guiding member defining at least one groove slidably engagable with an edge of said circuit card and a pair of parallel channels receiving said alignment pins such that said alignment pins align said guiding member for receiving, in said at least one groove, said circuit card for connection to said connector.

10. The connecting device of claim 9 wherein said guiding member has two opposite sides, each of said sides defining one of said at least one groove.

11. The connecting device of claim 9 wherein said at least one groove is substantially parallel to said channels.

12. The connecting device of claim 9 wherein each of said at least one groove is substantially U-shaped and wherein each of said channels is substantially C-shaped or cylindrical.

13. The connecting device of claim 9 wherein said connector comprises a receptacle for receiving a circuit card.

14. The connecting device of claim 9 wherein said alignment pins are removably attached to said base.

15. The connecting device of claim 14 wherein each of said alignment pins terminates in a fastener for attachment to said base.

16. The connecting device of claim 15 wherein said fastener of each of said alignment pins is a screw thread, said base having a pair of complimentary screw threads for engaging said screw threads of said alignment pins, and wherein a channel of said channels receiving a given alignment pin is configured so as to allow rotation of said given alignment pin.

17. The connecting device of claim 16 wherein at least one of said alignment pins has an enlarged head remote from its fastener for abutting said guiding member when said at least one alignment pin is received in one of said channels and attached to said connecting device so as to secure said guiding member in an aligned position.

18. The connecting device of claim 17 wherein said fastener is a first fastener and said enlarged head is engagable to a second fastener for securing a circuit card connected to said connector and received in said groove.

19. The connecting device of claim 17 further comprising a block member mountable adjacent said enlarged head such that said block member extends laterally from said at least one alignment pin.

20. A guide for a circuit card connecting device, said connecting device having a connector for connecting a circuit card on its front side, said guide comprising:

a pair of alignment means rotatably attachable to said connecting device adjacent said connector;

a guiding member having guiding means for slidably engaging a circuit card and receiving means for reception of said alignment means in parallel such that when said alignment means are received in said guiding member and attached to said connecting device, said guiding member is aligned for engagement with a circuit card to be connected to said connecting device.

* * * * *